United States Patent [19]

Hasegawa et al.

[11] Patent Number: 4,868,047

[45] Date of Patent: Sep. 19, 1989

[54] PRINTED WIRING BOARD

[75] Inventors: Akira Hasegawa; Masayuki Ishiwa, both of Hiratsuka, Japan

[73] Assignee: Furukawa Denki Kogyo Kabushiki Kaisha, Tokyo, Japan

[21] Appl. No.: 158,247

[22] Filed: Feb. 19, 1988

[30] Foreign Application Priority Data

Feb. 20, 1987 [JP] Japan .................................. 62-35850

[51] Int. Cl.4 ............................................... B32B 3/00
[52] U.S. Cl. ..................... 428/324; 428/433; 428/458; 428/480; 428/901; 264/104; 528/271; 528/392; 525/425; 525/433; 525/439
[58] Field of Search ............... 428/324, 433, 458, 480, 428/209, 901; 264/104; 528/271, 392; 525/425, 433, 439

[56] References Cited

U.S. PATENT DOCUMENTS

| | | | |
|---|---|---|---|
| 3,158,528 | 11/1964 | Brown | 428/324 |
| 3,258,387 | 6/1966 | Brown et al. | 428/324 |
| 3,470,045 | 9/1969 | Bronnvai et al. | 428/324 |
| 3,523,061 | 8/1970 | Purvis | 428/324 |
| 4,273,825 | 6/1981 | Nishiyama et al. | 428/324 |
| 4,291,084 | 9/1981 | Segal | 428/324 |
| 4,371,579 | 2/1983 | McCaskey et al. | 428/324 |
| 4,418,241 | 11/1983 | Fujiwara | 428/324 |
| 4,500,603 | 2/1985 | Freundlich | 428/409 |

FOREIGN PATENT DOCUMENTS 5632537  8/1979  Japan .
60121791 12/1983 Japan .
6259661  9/1985  Japan .

Primary Examiner—Ellis P. Robinson
Assistant Examiner—Patrick J. Ryan
Attorney, Agent, or Firm—Michael N. Meller

[57] ABSTRACT

An injection molding resin-type printed wiring board having an electric circuit pattern layer formed integrally on the surface thereof and having reduced warpage. In the printed circuit board, the injection molding resin includes a thermoplastic resin composition essentially comprising polyethylene terephthalate and containing a flaky inorganic reinforcing material. The inorganic reinforcing material comprises single-substance fine mica flakes or a mixture of fine mica flakes and short glass fibers.

2 Claims, 1 Drawing Sheet

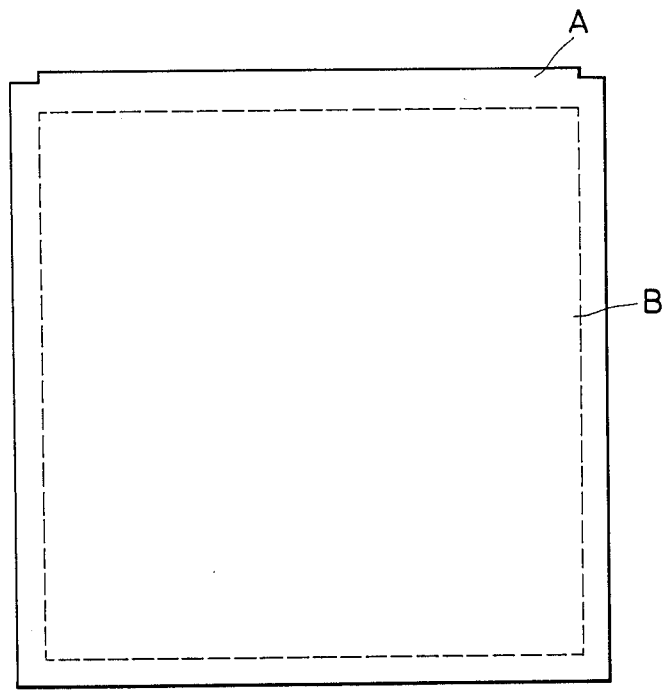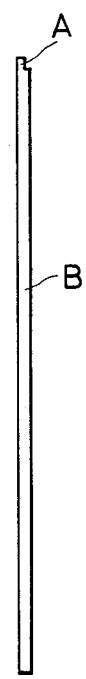
FIG.1  FIG.2
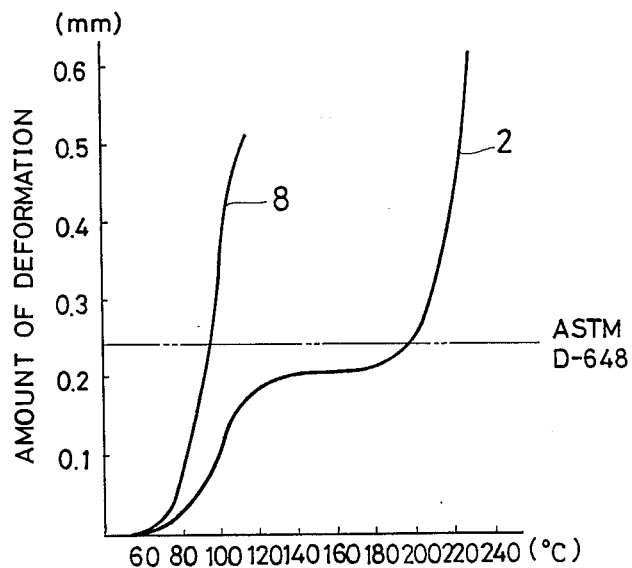
FIG.3

PRINTED WIRING BOARD

BACKGROUND OF THE INVENTION

1. Field of the Invention

The present invention relates to an injection molding resin-type printed wiring board having an electrical circuit pattern layer formed integrally on its surface.

2. Description of the Prior Art

Japanese Laid-Open Patent No. 60-121791, for example, has disclosed a technique in which a printed wiring pattern in the form of a transfer sheet is preliminarily set in a board injection mold so that simultaneously with the injection molding of a resin, the wiring pattern is formed on the surface of a molded product board.

In the past, injection molding resin materials used for this type of molded printed wiring boards have been the so-called super engineering plastics such as polysulfone, polyether sulfone and polyether imide and it has been true that these materials have the disadvantage of being high in cost.

A molding resin material meeting the required functions of such molded printed wiring board by the injection molding method, is required to satisfy various requirements that the board is small in warpage and torsion during the molding and solder mounting, that the electrical characteristics are satisfactory as the printed wiring board, that there is less danger of change in dimension, shape and electrical characteristics due to the absorption of moisture, that there is no danger of causing such damages as deformation and breaks in the printed wiring pattern on a transfer sheet set in the mold cavity during the injection operation, that good adhesion is ensured between the printed wiring board and the printed wiring pattern on the transfer sheet by the injection molding, that the product surface has an excellent external appearance and tinting properties when concurrently used as an outer component such as a housing and so on.

SUMMARY OF THE INVENTION

It is the primary object of the present invention to provide an injection molding resin-type printed wiring board employing a general-purpose engineering plastic as an injection molding resin material, thereby satisfying the previously mentioned requirements.

Noting the economy of printed wiring boards made by a method in which transfers a wiring pattern is transferred onto a board simultaneously with its injection molding, the inventors earnestly studied a resin material for printed wiring board which satisfies the previously mentioned requirements without ruining the advantages of the method and discovered that a very economical printed wiring board meeting the requirements can be produced only by the injection molding of a thermoplastic resin composition essentially comprising polyethylene terephthalate and containing an inorganic reinforcing material, the inventers thereby attained the invention.

More specifically, in accordance with the invention an injection molding resin-type printed wiring board having an electric circuit pattern layer integrally molded on its surface has a feature that the injection molding resin includes a thermoplastic resin composition essentially comprising polyethylene terephthalate and a flaky inorganic reinforcing material.

The polyethylene terephthalate used in the invention is the so-called polymer comprising terephthalic acid and ethylene glycol or a copolymer or mixture essentially comprising the former polymer.

The polyethylene terephthalate is a crystalline resin and it has an exceedingly high heat resistance as compared with the other general-purpose engineering plastics. However, when this resin is used as a single substance, the heat resistance of the resulting general product is insufficient as compared with that of a printed wiring board and thus in accordance with the invention an inorganic reinforcing material is added to the resin.

While various kinds of materials may be used as the inorganic reinforcing material, in accordance with the invention the use of fine mica flakes singly or a mixture of fine mica flakes and short glass fibers is particularly preferred.

The fine mica flakes are in the form of flat pieces or scales and have no two-dimensional anisotropy and therefore, when uniformly dispersed and distributed in a resin for injection molded board, reduce the shrinkage of the molded resin irrespective of the direction of flow of the resin in the die cavity, and effectively prevent the warpage and torsion in the board as molded or when subjected to a heat as in soldering. In this case, since no effect on the occurrence of warpage and torsion can be obtained if the average diameter of the fine mica flakes is smaller than 50μ and since the average diameter of greater than 200 μm not only makes the injection molding of the resin difficult but also deteriorates the external appearance thus even tending to cause damages to the electric circuit pattern, preferably the mica flakes of the average diameter between 50 and 200 μm (more preferably 100 to 120 μm) are used.

In other words, according to one aspect of the invention the inorganic reinforcing material comprises single-substance fine mica flakes and more preferably the fine mica flakes are dispersed and contained in an amount between 10 and 60 weight %. The reason for selecting the preferred content of the fine mica flakes between 10 and 60 weight % is that where the mica flakes are added singly, the mica flake content of over 10 weight % is necessary for improving the heat resistance of the polyethelene terephthalate itself to the level required by printed wiring boards, whereas the content of greater than 60 weight % has a detrimental effect on the injection moldability.

Also, while the short glass fibers are added so as to improve the board strength, preferably the short fibers having a thickness of about 10μ and a length of over 0.3 mm and prepared by cutting glass strand or roving are used. While these short glass fibers are effective in improving the heat resistance and mechanical strength of the board, in the molded product the orientation of the short fibers in directed along the direction of flow of the resin in the mold cavity so that the difference in shrinkage is caused in the molded resin between the direction of flow and the direction perpendicular to the direction of flow, thus causing warpage and torsion in the molded resin. In accordance with the invention, where such short glass fibers are used, the previously-mentioned fine mica flakes are infallibly mixed and the effect of the difference in shrinkage is compensated for by the previously mentioned warpage and torsion preventing effect attributable to the fine mica flakes.

In other words, in accordance with another aspect of the invention the inorganic reinforcing material comprises a mixture of short glass fibers and fine mica flakes. In this case, the mixture is always preferred to contain less than 30 weight % (more preferably 10 to 20 weight %) of short glass fibers and 5 to 40 weight % (more preferably 10 to 30 weight %) of fine mica flakes in dispersed form, and moreover the total amount of this inorganic reinforcing material is limited to a range from 10 to 60 weight % (more preferably 15 to 40 weight %). Here, the preferred contents of the inorganic reinforcing material mixture are determined in this way for the reasons that the short glass fiber content of over 30 weight % not only increases the previously mentioned shrinkage difference in the product but also decreases the flowability of the mollten resin itself in the mold thereby deteriorating the shape quality of the product, and that the fine mica flake content of less than 5 weight % makes insufficient the shrinkage difference compensating effect and the content of over 40 weight % results in the mixing of a large amount of the mica which is flat in shape thus making the resulting product fragile, decreasing the mechanical strength, deteriorating the moldability and tending to cause such damages as breaking and deformation of the electric circuit pattern.

In accordance with the invention, the method of dispersing and mixing the short glass fibers and the fine mica flakes in the polyethylene terephthalate may for example be one comprising the steps of preparing a molten polyethylene terephthalate mixed with fine mica flakes, applying the molten polyethylene terephthalate to a glass strand or roving of about 10μ thick by the method of cable coating and then cutting the coated glass strand or roving to a suitable length, preferably over 0.3 mm and using the resulting short pellets as an injection molding starting resin for wiring boards or another comprising the steps of mixing polyethylene terephthalate with fine mica flakes with or without milled fibers prepared by cutting and grinding a glass strand, melting the mixture and forming into a slender rod-like shape by extrusion molding, cutting the shape to a suitable dimension and using the resulting small-size pellets as an injection molding starting resin for wiring boards. In addition, it is possible to use still another method comprising for example the steps of adding fine mica flakes to a polyethylene terephthalate containing no glass fibers during or after the polymerization or simply adding fine mica flakes to a polyethylene terephthalate molding material containing glass fibers and then mixing the materials by use of an ordinary mixer.

It is to be noted that in accordance with the invention a so-called nucleating agent which acts as a crystal nucleating agent or a substance having a function of essentially increasing the crystallization temperature and hence the rate of crystallization of the polyethylene terephthalate may be added to the previously mentioned resin composition forming the board. In addition, it is possible to add, as a lubricant, a crystallization promotor which acts, along with the nucleating agent, to increase the rate of crystallization as well as the range of crystallization temperatures of the polyethylene terephthalate, thereby increasing the rate of crystallization in cases where a low temperature mold is used. Also, one or more kinds of metal oxides may be used, and it is needless to say that additives such as an oxidation inhibitor, heat stabilizer and ultraviolet inhibitor, coloring agent such as dye or pigment, fire retardent agent, antistatic agent and foaming agent may be added so far as the essential properties of the board are not impaired in any way. Further, with a view to improving the surface external appearance, toughness, etc., it is possible to blend, as a so-called alloy, any of thermoplastic resins such as polyethylene, polypropylene, acrylic resin, fluorine resin, polyamide, polyacetal, polycarbonate, polysulfone, polyphenylene oxide, polyphenylene sulfide and polybutylene terephthalate, thermosetting resins such as phenolic resin, melamine resin, polyester resin, silicon resin, epoxy resin and diallyl phthalate resin and soft thermoplastic resins such as ethylene/vinyl acetate copolymer, polyester elastomer and ethylene/propylene polymer.

Still further, in accordance with the invention, the shape of the molded board is arbitrary and it is not limited to the flat one.

In accordance with the invention there is thus provided a printed wiring board which is produced by an injection molding method in such a manner that the board is molded without ruining the flowability of a resin during the molding and without causing damages such as deformation, breaking, etc., to a circuit pattern on a transfer sheet placed in a mold, that the occurrence of warpage and torsion is decreased extremely not only in the as-molded form but also after the heat treatment, e.g., soldering and that changes in the dimension, shape and electronic characteristics due to the absorption of moisture are reduced and an excellent external appearance is ensured.

The above and other objects, features and advantages of the present invention will become more apparent from the following detailed description of embodiments shown by way of example and not limitation when taken in conjunction with the accompanying drawings.

BRIEF DESCRIPTION OF THE DRAWINGS

FIG. 1 is a front view showing the cavity of an injection mold used with an embodiment of the present invention.

FIG. 2 is a side view of FIG. 1.

FIG. 3 is a graph showing the measured results of the relation between the temperature and the amount of deformation of molded boards.

DESCRIPTION OF THE PREFERRED EMBODIMENTS

Printed wiring boards were injection molded in a cavity-type mold shown in FIGS. 1 and 2. In the FIG., symbol A designates a film gate, and B a board molding section. The injection molding was effected by preliminarily arranging a transfer sheet (not shown) at a position shown by the broken line in the board molding section B. The transfer sheet used was prepared by printing a circuit pattern with a conductive paste on a polyethlene terephthalate film whose surface was treated with silicon and melamine resins and then printing an adhesive agent on the surface of the surface treated film. Note that in addition to this, a polyimide film or the like is well suited for use as the base film of the transfer sheet. Also, while the transfer sheet used included the single circuit layer, it is of course possible to use a transfer sheet of a multilayer circuit type prepared by repeating the printing of a circuit pattern with a conductive paste through the intermediary of an insulating layer.

The injection molding operation itself is the same as the ordinary method and the conditions of the injection molding performed in the cavity-type die of FIG. 1 may be summarized by way of example, as follows.

| | |
|---|---|
| *Screw cylinder temperature (front) | 260–265° C. |
| *Screw cylinder temperature (middle) | 260–265° C. |
| *Screw cylinder temperature (rear) | 270–290° C. |
| *Mold temperature | 110–140° C. |
| *Injection pressure | 850 Kg/cm$^2$ |
| *Holding pressure | 800 Kg/cm$^2$ |
| *Injection and holding pressure time | 10 sec. |
| *Screw speed | 60 r.p.m. |
| *Cooling time | 45 sec. |
| *Total cycle time | 55–60 sec. |

The injection molding resin materials were prepared by first mixing a polyethylene terephthalate having a melting point of 287° C. and inherent viscosity of 0.53, fine mica flakes (the mica flakes manufactured by Marietta Resouces International Ltd., U.S.A.: Trade Name "SZOLITE" Registered Trademark) and glass fibers (9 μm in diameter) each in various contents, melting, extruding and cutting the mixtures, thereby preparing the various resin materials in the form of pellets of about 3 mm in diameter and 6 mm in length. The injection molding of these kinds of resin material pellets was effected in such a manner that with the transfer sheet preliminarily arranged in the mold of the injection molding machine, the resin material pellets were subjected to hot drying at 160° C. for 3 hours and then were immediately fed into the injection molding machine thereby performing the injection molding under the conitions including the injection resin temperature of 290° C., the mold temperature of 135° C., the injection pressure of 850 Kg/cm$^2$ and the cooling time of 45 seconds. The resulting printed wiring boards were cut into sample pieces and their physical properties were measured. Table 1 shows the composition of the molded boards made of the resin materials of the different compositions belonging to the scope of the invention, the physical properties in the as-molded condition, the physical properties after a heat treatment (200° C.×30 minutes) supposing a low temperature soldering and appraisals (◯: good, Δ: average, ×: bad), and Table 2 shows the similar data of molded boards made of resin materials having composition beyond the scope of the invention.

Note that the warpage and torsion in Tables 1 and 2 were measured in accordance with the paragraphs on warpage and torsion of the JIS C 6481-Printed Circuit Copper-Clad Laminated Sheet Test Method 5.4, and the impact strengths show the results of the notch impact tests made in accordance with the JIS K 7110-Izod Impact Test Method for Hard Plastics.

TABLE 1

| Sample No. | 1 | 2 | 3 | 4 | 5 | 6 | 7 |
|---|---|---|---|---|---|---|---|
| Glass fibers (wt %) | 0 | 15 | 15 | 20 | 20 | 20 | 30 |
| Mica flakes (wt %) | 10 | 20 | 20 | 5 | 10 | 40 | 10 |
| Mica diameter (μm) | 50~200 | 50~200 | 100~120 | 50~200 | 50~200 | 50~200 | 50~200 |
| Warpage after molding (mm) | 0.2 | 0.2 | 0.1 | 0.8 | 0.6 | 0.4 | 0.8 |
| Torsion after molding (mm) | 0.4 | 0.3 | 0.1 | 0.9 | 0.8 | 0.5 | 1.0 |
| Warpage after heating (mm) | 0.3 | 0.3 | 0.1 | 1.0 | 0.7 | 0.5 | 1.0 |
| Torsion after heating (mm) | 0.4 | 0.4 | 0.3 | 1.2 | 1.0 | 0.7 | 1.2 |
| Impact strength (Kg-m) | 3.8 | 4.7 | 5.0 | 6.5 | 6.4 | 5.3 | 7.0 |
| Appraisal: | | | | | | | |
| Heat resistance | ◯ | ◯ | ◯ | ◯ | ◯ | ◯ | ◯ |
| Moldability | ◯ | ◯ | ◯ | ◯ | ◯ | ◯ | ◯ |
| Appearance | ◯ | ◯ | ◯ | ◯ | ◯ | ◯ | ◯ |

TABLE 2

| Sample No. | 8 | 9 | 10 | 11 | 12 | 13 | 14 |
|---|---|---|---|---|---|---|---|
| Glass fibers (wt %) | 2 | 20 | 20 | 30 | 40 | 15 | 15 |
| Mica flakes (wt %) | 5 | 0 | 50 | 40 | 10 | 20 | 20 |
| Mica diameter (μm) | 50~200 | — | 50~200 | 50~200 | 50~200 | 20~50 | 200~ |
| Warpage after molding (mm) | 0.7 | 1.8 | 0.3 | 0.1 | 1.3 | 1.8 | 0.1 |
| Torsion after molding (mm) | 0.9 | 2.0 | 0.4 | 0.7 | 1.4 | 2.0 | 0.2 |
| Warpage after heating (mm) | 1.2 | 2.2 | 0.5 | 0.8 | 1.7 | 2.2 | 0.2 |
| Torsion after heating (mm) | 1.3 | 3.0 | 0.7 | 1.2 | 2.0 | 2.9 | 0.3 |
| Impact strength (Kg-m) | 2.9 | 6.9 | 4.7 | 6.4 | 10.2 | 5.2 | 5.8 |
| Appraisal: | | | | | | | |
| Heat resistance | × | ◯ | ◯ | ◯ | ◯ | ◯ | ◯ |
| Moldability | ◯ | ◯ | × | × | Δ | ◯ | × |
| Appearance | Δ | × | ◯ | ◯ | × | × | ◯ |

Here, the tolerance limits of warpage and torsion are such that as stated in JIS C 6482-6485, the percentages of the warpage and torsion are less than 6% (JIS C 6482, 6483, 6485) or less than 4% (JIS C 6484) when the thicknesses of boards are in the range from 2.4 to 3.2 mm. The molded boards having a size of 20×200×2.4 mm were produced by the use of the die cavity shown in FIGS. 1 and 2 and the application of the warpage and torsion tolerance limits of less than 4% shows that the essential requirements for conforming products are the warpage and torsion of less than 1.6 mm.

In Table 1, the samples No. 1 to 7 showed the satisfactory results in the appraisal of the warpage and torsion as well as the other physical properties. In particular, the molded board of the sample No. 3 had the glass fiber content of 15 wt %, the mica average diameter of 100 to 120 μm and the mica content of 20 wt %, and in this case not only the warpage and torsion values in the as-molded condition and those after the heat treatment at 200° C. for 30 minutes were both extremely small but also the molded board was excellent in heat resistance, moldability and external appearance and satisfactory in electrical characteristics and resistance to moisture.

The sample No. 8 was insufficient with respect to the amounts of the glass fibers and the fine mica flakes thus failing to derive the advantages of the crystallizability of the polyethylene terephthalate and it was insufficient in heat resistance, high in warpage and torsion after heat treatment and low in impact strength.

In the case of the sample No. 9 containing only the glass fibers without any fine mica flakes, the warpage and torsion were high in the as-molded condition, thus making it impossible to use it as a printed wiring board.

In the case of the sample No. 10, the amount of the fine mica flakes was excessively large with the resulting deterioration of the flowability of the resin material during the molding and the moldability, and the molded board was a defective product in that it was fragile and the external appearance showed the rougened surface due to the effect of the mica flakes.

In the case of the sample No. 11, the total amount of the glass fibers and fine mica flakes was excessively large with the resulting deterioration of the flowability of the molding resin material and the moldability and also the molded product was fragile.

In the case of the sample No. 12 illustrating that the effect of the anisotropy of the 40 wt % glass fibers was not compensated by the fine mica flakes, the relative shortage of the fine mica flakes caused the occurrence of warpage and torsion although the strength of the molded board was increased, and also the flowability of the molding resin was low with the resulting insufficient moldability.

The sample No. 13 was illustrative of the case in which the average diameter of the fine mica flakes was excessively small and in this case the warpage and torsion were not practically reduced.

The sample No. 14 was illustrative of the instance where the average diameter of the fine mica flakes was excessively large and in this case the external appearance of the molded board surface was deteriorated due to the effect of the mica flakes.

FIG. 3 shows the the relation between the temperature and the amount the deformation of the molded boards measured with respect to the samples No. 2 and No. 8. In the FIG., the curve 2 shows a temperature-deformation curve of the sample No. 2 and the curve 8 shows a temperature-deformation curve of the sample No. 8. While, in the case of the sample No. 8 which was not made according to the invention, the amount of deformation exceeded 0.3 mm at around 100° C., the amount of deformation remained low up to about 200° C. in the case of the sample 2 according to the invention.

As seen from the results of Tables 1 and 2, in accordance with the invention an injection molded resin board meeting the essential requirements for printed wiring board is produced by using a polyethylene terephthalate composition containing 10 to 60 wt % (preferably 15 to 40 wt %) of fine mica flakes having an average diameter of 50 to 200 μm (preferably 100 to 120 μm) when the fine mica flakes are contained singly as an inorganic reinforcing material or a polyethylene terephthalate composition containing less than 30 wt % (preferably 10 to 20 wt %) of glass fibers and 5 to 40 wt % (preferably 10 to 30 wt %) of fine mica flakes having an average diameter of 50 to 200 μm (preferably 100 to 120 μ) thus having a total inorganic reinforcing material content of 10 to 60 wt % (preferably 15 to 45 wt %) when a mixture of the glass fibers and the fine mica flakes is contained as the inorganic reinforcing material.

We claim:

1. An injection molding resin-type printed wiring board having a molded electric circuit pattern layer integrally formed on the surface thereof, wherein said injection molding resin includes a thermoplastic resin composition essentially comprising polyethylene terephthalate and a flaky inorganic reinforcing material, said flaky inorganic reinforcing material consisting essentially of 10 to 60 weight % of fine mica flakes dispersedly contained in said composition "and wherein said fine mica flakes have an average diameter of 50 to 200 um."

2. An injection molding resin-type printed wiring board having a molded electric circuit pattern layer integrally formed on the surface thereof, wherein said injection molding resin includes a thermoplastic resin composition essentially comprising polyethylene terephthalate and a flaky inorganic reinforcing material dispersedly contained in the composition, said flaky inorganic reinforcing material consisting essentially of 30 weight % of less of short glass fibers and 5 to 40 weight % of fine mica flakes, the total amount of said inorganic reinforcing material being in the range of from 10 to 35 weight % "and wherein said fine mica flakes have an average diameter of 50 to 200 um."

* * * * *